United States Patent
Yoon et al.

(10) Patent No.: US 8,236,690 B2
(45) Date of Patent: Aug. 7, 2012

(54) METHOD FOR FABRICATING SEMICONDUCTOR PACKAGE SUBSTRATE HAVING DIFFERENT THICKNESSES BETWEEN WIRE BONDING PAD AND BALL PAD

(75) Inventors: Kyoung Ro Yoon, Daejeon (KR); Young Hwan Shin, Daejeon (KR); Yoon Su Kim, Gangwon-do (KR); Tae Gon Lee, Daejeon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 17 days.

(21) Appl. No.: 12/801,723

(22) Filed: Jun. 22, 2010

(65) Prior Publication Data
US 2010/0261348 A1 Oct. 14, 2010

Related U.S. Application Data

(62) Division of application No. 11/495,649, filed on Jul. 31, 2006, now Pat. No. 7,768,116.

(30) Foreign Application Priority Data

Sep. 27, 2005 (KR) .................. 10-2005-0090019

(51) Int. Cl.
*H01L 21/44* (2006.01)
(52) U.S. Cl. ................. 438/672; 257/E21.536
(58) Field of Classification Search .......... 438/672, 438/669, 675, 674, 107–108, 123–125; 257/E21.536, E21.575
See application file for complete search history.

(56) References Cited

U.S. PATENT DOCUMENTS
2005/0241954 A1* 11/2005 Iwanami .................. 205/182

FOREIGN PATENT DOCUMENTS

| JP | 62-72133 | 4/1987 |
| JP | 4-268783 | 9/1992 |
| JP | 2001-53116 | 2/2001 |
| JP | 2001-094026 | 4/2001 |
| JP | 2004-39716 | 2/2004 |
| JP | 2004-140075 | 5/2004 |
| JP | 2004-221600 | 8/2004 |
| KR | 10-2004-0061257 | 7/2004 |

OTHER PUBLICATIONS

U.S. Appl. No. 11/495,649, filed Jul. 31, 2006, Kyoung Ro Yoon et al., Samsung Electo-Mechanics Co., Ltd.
Korean Office Action, dated Oct. 31, 2006 issued in corresponding Korean Patent Application No. 10-2005-0090019.
Chinese Office Action, dated Dec. 21, 2007 issued in corresponding Chinese Patent Application No. 2006101116354.
U.S. Office Action dated Jul. 9, 2008, issued in the file history of U.S. Appl. No. 11/495,649.
U.S. Office Action dated Feb. 4, 2009, issued in the file history of U.S. Appl. No. 11/495,649.
U.S. Office Action dated Jul. 20, 2009, issued in the file history of U.S. Appl. No. 11/495,649.
U.S. Notice of Allowance dated Mar. 22, 2010, issued in the file history of U.S. Appl. No. 11/495,649.

* cited by examiner

*Primary Examiner* — Hoa B Trinh

(57) ABSTRACT

A method for fabricating a semiconductor package substrate, including: preparing a copper clad laminate and half etching a copper foil on a wire bonding pad side of the copper clad laminate; depositing a first etching resist on the opposite sides of the copper clad laminate; forming circuit patterns on the first etching resist, constructing circuits including a wire bonding pad and a ball pad after the model of the circuit patterns, and removing the first etching resist; applying a solder resist to the copper clad laminate in such a way to expose the wire bonding pad and the ball pad; and plating the wire bonding pad with gold and subjecting the ball pad to surface treatment.

3 Claims, 9 Drawing Sheets

FIG.1A – Prior Art
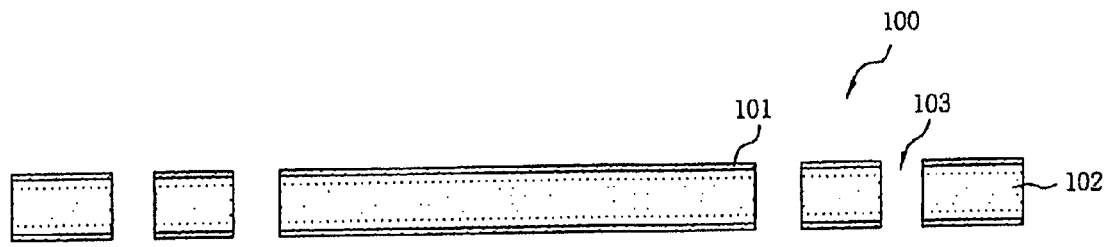
FIG.1B – Prior Art
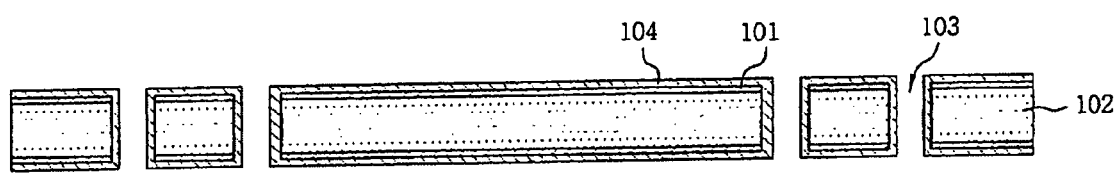
FIG.1C – Prior Art
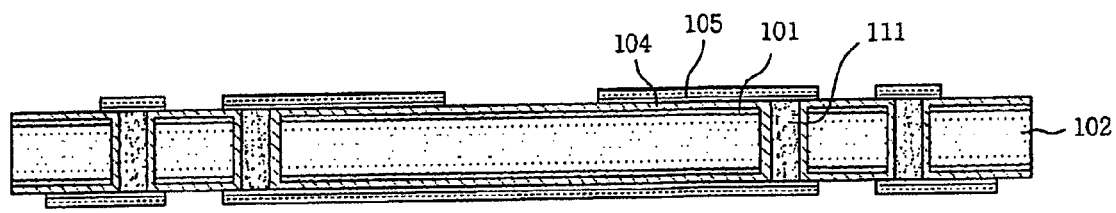
FIG.1D – Prior Art
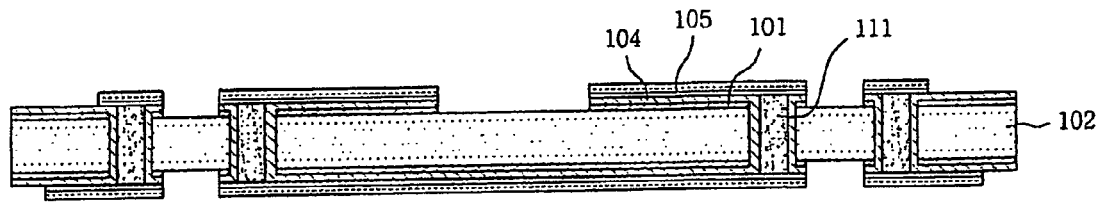

FIG. 1E – Prior Art
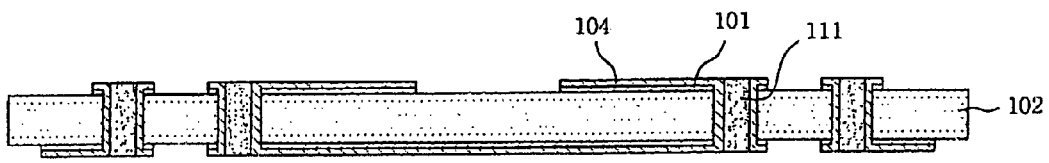
FIG. 1F – Prior Art
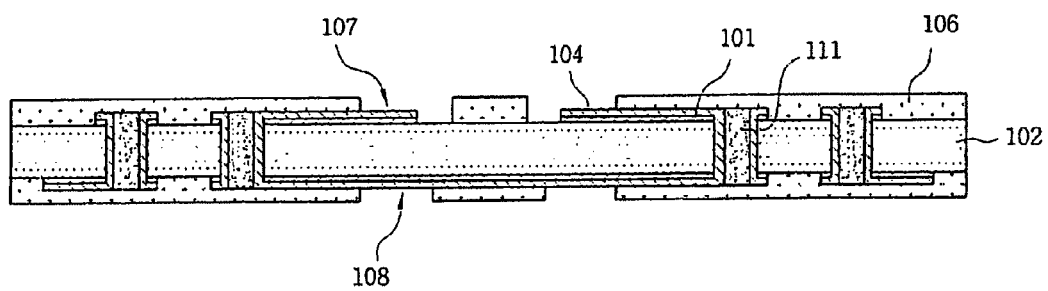
FIG. 1G – Prior Art
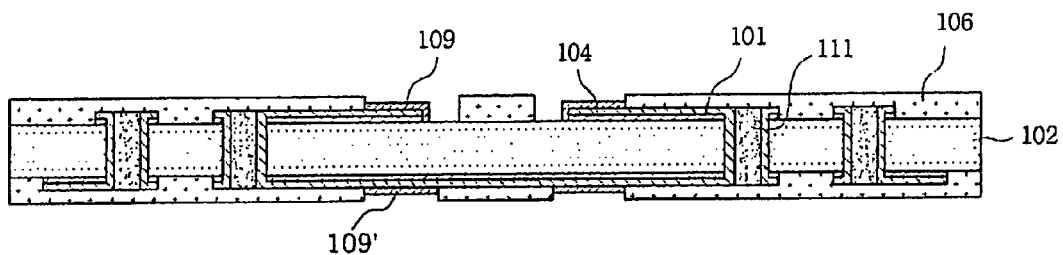
FIG. 1H – Prior Art
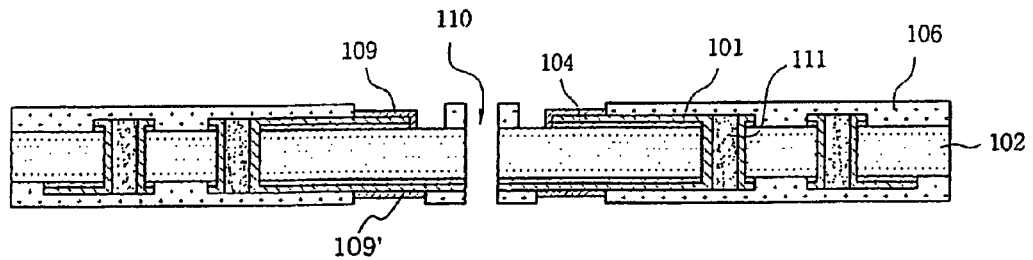

FIG.2 – Prior Art
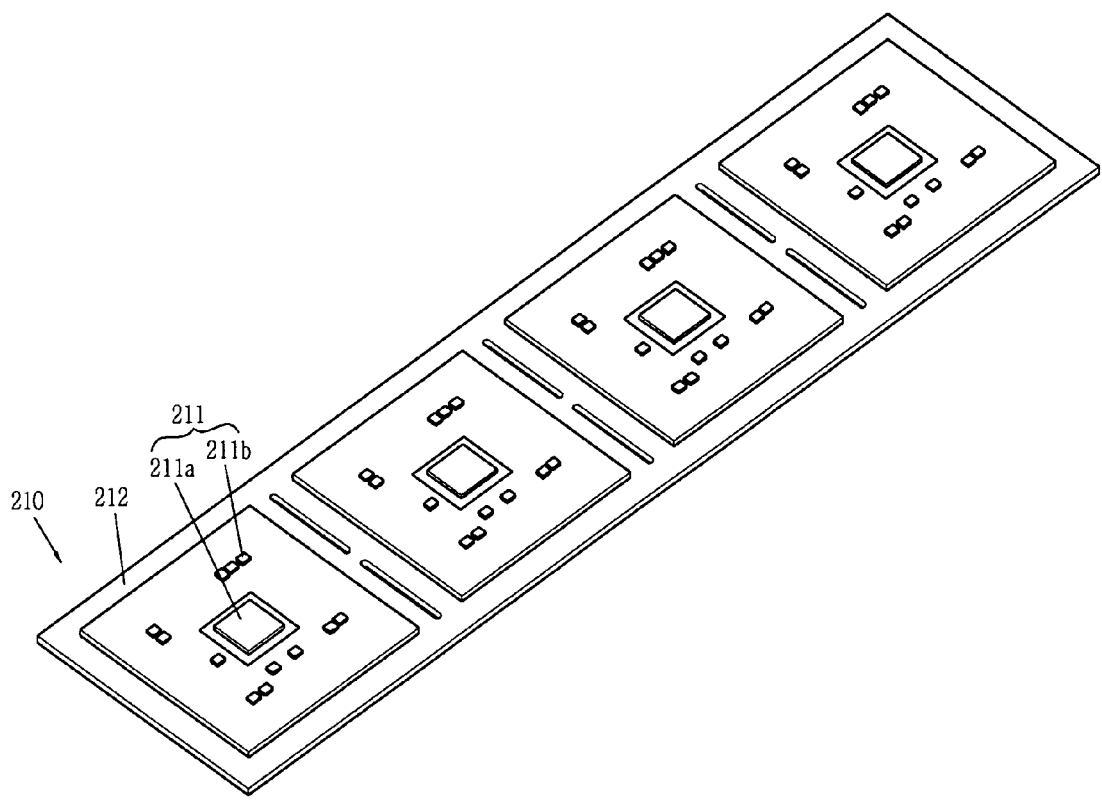

METHOD FOR FABRICATING SEMICONDUCTOR PACKAGE SUBSTRATE HAVING DIFFERENT THICKNESSES BETWEEN WIRE BONDING PAD AND BALL PAD

CROSS-REFERENCE TO RELATED APPLICATIONS

This application is a divisional and claims priority to U.S. application Ser. No. 11/495,649, filed Jul. 31, 2006 now U.S. Pat. No. 7,768,116, which in turn claims the benefit of Korean Patent Application 10-2005-0090019 filed with the Korean Intellectual Property Office on Sep. 27, 2005, the disclosures of which are incorporated herein by reference in their entirety.

BACKGROUND

1. Field

The present invention relates to a semiconductor package substrate and a method for fabricating the same. More particularly, the present invention relates to a semiconductor package in which a circuit layer formed on the wire bonding pad side is different in thickness from a half-etched circuit layer formed on the ball pad side and which has a connection through hole through which the plating lead lines of the wire bonding pad side and the ball pad side are electrically connected, so that electrical disconnection is prevented when the plating lead line of the wire bonding pad is cut, and a method for fabricating the same.

2. Description of the Related Art

With the evolution of electronics towards slimness, lightness and high performance, a great advance in technology for fine circuit patterns has been recently achieved on BGA package substrates.

Particularly, fine circuit patterns are extensively required in CSP (chip-sized package) products, which have semiconductor chips mounted on BGA package substrates.

In order to better understand the background of the invention, a conventional method of fabricating a semiconductor package substrate will be described with reference to FIGS. 1A to 1H.

As shown in FIG. 1A, a copper clad laminate (CCL) 100 comprising an insulation layer 102 covered with a copper foil 101, which is provided as a base substrate, is drilled to form therein via holes for electric communication between circuit layers. There are a variety of CCLs including glass/epoxy CCLs, heat resistant CCLs, paper/phenol CCLs, CCLs for use in radio frequencies, flexible CCLs (polyimide film) and composite CCLs, which are used according to purpose. For example, glass/epoxy CCLs are suitable for the fabrication of double-sided PCBs and multilayer PCBs.

Then, the opposite sides of the CCL 100 and the inner walls of the via holes are subjected to electroless plating and then to electroplating, as shown in FIG. 1B. Requiring electricity, electroplating cannot be conducted on the insulation layer 102. Usually, an insulator is electroless plated prior to being electroplated. Thus, copper is electroless plated and then electroplated on the insulation layer 102.

Next, a filler is charged in the via holes 103, followed by the formation of an etching resist pattern 105 as shown in FIG. 1C. In regard to the etching resist pattern 105, it is formed using a dry film (D/F) and a circuit pattern printed film (artwork film) on the copper-electroplated substrate.

There are various techniques available for the formation of the resist pattern 105, with a dry film technique prevailing.

A dry film for use in forming the resist pattern, abbreviated to D/F, is usually comprised of a cover film, a photoresist film and a Mylar film. The photoresist film actually serves as a resist.

While being stripped of the cover film, the dry film is applied to a bare PCB. A circuit pattern-printed artwork film is stuck fast onto the dry film, followed by UV irradiation. UV light cannot penetrate through the dry film at the dark portion of the pattern of the artwork film, but penetrates through otherwise portions to cure the exposed portion of the dry film. Then, the substrate is immersed in a developing solution to remove the uncured portions of the dry film while the cured portions remain to form a resist pattern. A 1% sodium carbonate ($Na_2CO_3$) or potassium carbonate ($K_2CO_3$) solution is suitable as a developing solution.

Afterwards, as shown in FIG. 10, the CCL 100 is treated with an etchant while the etching resist pattern 105 serves as a mask, so as to form a circuit pattern.

Subsequently, the etching resist 105 is removed with a peeling solution such as an NaOH or KOH solution, as shown in FIG. 1E.

All portions of the resulting CCL, except for a wire bonding pad 107, a solder ball pad 108, and the other portions connected to external substrates or chips, are coated with a photo solder resist 106 so as to protect the circuit, as shown in FIG. 1F.

Using a plating lead line, thereafter, the CCL is plated with Ni/Au, with the photo solder resist serving as a plating resist, to form an Ni/Au layer 109, 109' on the uncoated portions, that is, the wire bonding pad 107, the solder ball pad 108 and the other connection portions, as shown in FIG. 1G. Plating is conducted with Ni and then with Au.

Finally, FIG. 1H shows a package product obtained after the circuit pattern 110 serving as a plating lead line is cut using a router or a dicing process.

In CSP products, ball pitches have continued to decrease from 0.8 through 0.65 and 0.5 then to 0.4 mm. In addition, the balls require an OSP (organic solderability preservative) treatment so as to have a drop resistance the same level as that of substrates for mobile phones. However, the requirement causes contrast techniques to be performed on the substrate, as will be described below.

With reference to FIG. 2, a conventional semiconductor package substrate 210 is shown in a perspective view. As seen, the conventional semiconductor package substrate 210 is divided into a unit region, comprising a semiconductor device mounting portion 211a and an outer circuit pattern 211b, and a dummy region 212.

This conventional semiconductor package substrate requires contrast techniques which are used to keep the circuit layer at a small thickness so as to realize a fine pattern at the side of the wire bonding, but at a large thickness at the side of the balls so as to enable application of OSP and deep etching processes to the balls.

SUMMARY

Therefore, it is an object of the present invention to provide a semiconductor package device in which a circuit layer formed on a wire bonding pad side differs in thickness from a circuit layer formed on a ball pad side, and a method for fabricating the same.

It is another object of the present invention to provide a semiconductor package substrate which prevents electrical disconnection when a plating lead line of a wire bonding pad side is cut as a circuit layer is formed to a small thickness on the wire bonding pad side.

In accordance with an aspect of the present invention, provided is a semiconductor package substrate, comprising: an insulation layer; a first circuit layer, formed on one side of the insulation layer, for providing a ball pad; and a second circuit layer, formed on the other side of the insulation layer, for providing a wire bonding pad, said second circuit layer being thinner than said first circuit layer.

In accordance with another aspect of the present invention, provided is a method for fabricating a semiconductor package substrate, comprising: Step 1 of preparing a copper clad laminate and half-etching a copper foil on a wire bonding pad side of the copper clad laminate; Step 2 of depositing a first etching resist on the opposite sides of the copper clad laminate; Step 3 of forming circuit patterns on the first etching resist, constructing circuits including a wire bonding pad and a ball pad after the model of the circuit patterns, and removing the first etching resist; Step 4 of applying a solder resist to the copper clad laminate in such a way as to expose the wire bonding pad and the ball pad; and Step 5 of plating the wire bonding pad with gold and subjecting the ball pad to surface treatment.

BRIEF DESCRIPTION OF THE DRAWINGS

The application of the preferred embodiments of the present invention is best understood with reference to the accompanying drawings, in which like reference numerals are used for like and corresponding parts, wherein:

FIGS. 1A to 1H are schematic views showing processes of fabricating a conventional semiconductor package substrate;

FIG. 2 is a perspective view showing the conventional semiconductor package substrate;

DETAILED DESCRIPTION OF THE EMBODIMENTS

Below, a detailed description is given of an embodiment of the present invention with reference to the accompanying drawings.

Figure 3:
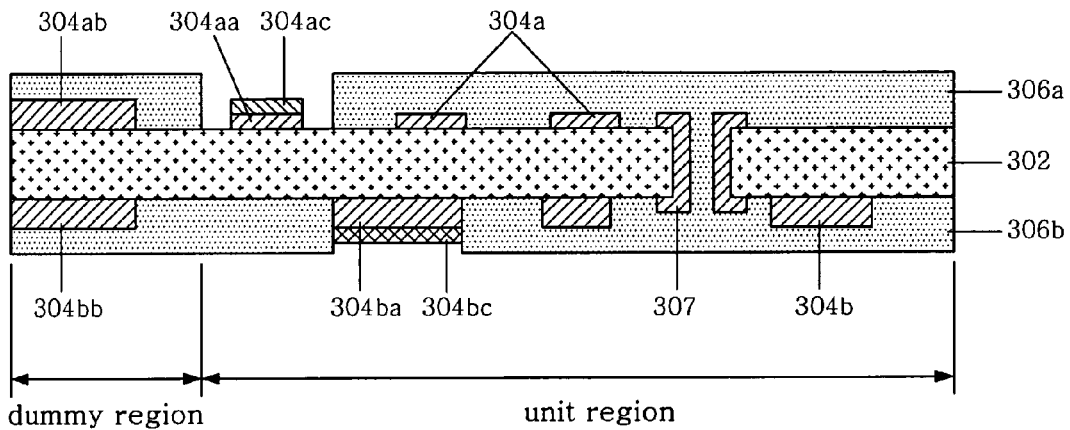
FIG. 3 is a cross sectional view showing a semiconductor package substrate according to an embodiment of the present invention, in which a circuit layer formed on a wire bonding pad side differs in thickness from a circuit layer formed on a ball pad side.

FIG. 3 is a cross sectional view showing a semiconductor package substrate according to an embodiment of the present invention, in which a circuit layer 304a on the side of a wire bonding pad differs in thickness from a circuit layer 304b on the side of a ball pad within a unit region. The circuit layer 304a of the wire bonding pad side is thinner than the circuit layer 304b of the ball pad side.

Within a dummy region, however, the thickness is identical between a circuit layer 304ab on the wide bonding pad side and a circuit layer bb on the ball pad side.

Thereby, when the circuit layer 304a on the wire bonding pad side in the unit region is thinner than the circuit layer 304ab on the wire bonding pad side in the dummy region and than the circuit layer 304b on the ball pad side in the unit region, a fine circuit pattern can be designed because the thickness of the circuit layer 304a has a great influence on the fineness of a circuit pattern.

On the wire pad side, the larger thickness of the circuit layer 304ab on the wire bonding pad side in the dummy region than that of the circuit layer 304a in the unit region prevents the distortion of substrate.

Additionally, the larger thickness of the circuit layer 304b on the ball pad side than that of the circuit layer 304a on the wire bonding pad side in the unit region allows OSP and deep etching processes to be applied to the ball pad side. In FIG. 3, reference numeral 302 refers to an insulation layer, 306a and 306b to photo solder resists, 304aa particularly to a wire bonding pad out of circular layer 304a, 304ac to a gold coat, 304ba to a ball pad, and 304bc to an OSP-treated surface.

A through-hole 307 serves to electrically connect a plating lead line (not shown) of the wire bonding pad side with that of the ball pad side. If the circuit layer 304a on the bonding pad side becomes thin, the thin plating lead line may be cut because it is contained in the circuit layer 304a. When the cutting occurs, the through-hole 307 allows electric connection to the outside through a plating lead line (not shown) on the ball pad side.

Alternatively, the circuit layer 304ab on the wire bonding pad side in the dummy region may be as thick as the circuit layer 304a on the wire bonding pad side in the unit region, but differs in thickness from the circuit layer 304b on the ball pad side in the unit region.

With reference to FIGS. 4A to 4G, a method for fabricating a semiconductor package substrate in which a circuit layer on a wire bonding side is different in thickness from that on a ball pad side are shown in a stepwise manner in accordance with an embodiment of the present invention.

Figure 4A:
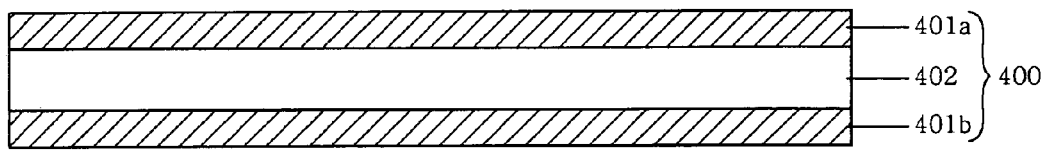
FIGS. 4A to 4G are cross sectional views showing processes of fabricating a semiconductor package substrate according to an embodiment of the present invention, in which a circuit layer formed on a wire bonding pad side differs in thickness from a circuit layer formed on a ball pad side.

FIG. 4A is a cross sectional view of a CCL 400 comprising an insulation layer 402, made from, for example, epoxy, with copper foil 401a and 401b bonded through an adhesive to the respective sides of the insulation layer.

Figure 4B:
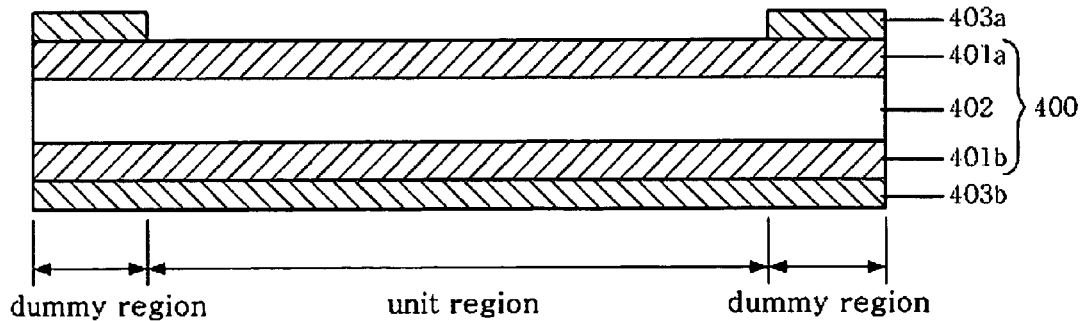

Then, as shown in FIG. 4B, a dry film 403a which is open at a portion corresponding to the unit region of the base substrate CCL is deposited on the copper foil 401a of the wire bonding pad side. While the dry film 403a serves as a mask, the unit region, exposed through the open portion of the dry film 403a, is half etched so that the copper foil 401a has different thicknesses at the unit region and at the dummy region.

Because there is no need to half etch the copper foil 401b on the solder ball pad side, a blanket of the dry film 403b is deposited over the copper foil 401b on the ball pad side. Alternatively, in the case where the copper foil 401a in the unit region has the same thickness as that of the copper foil 401b in the dummy region, a half etching process can be conducted without use of the dry film 403a, which is open at a portion corresponding to the unit region of the CCL.

Figure 4C:
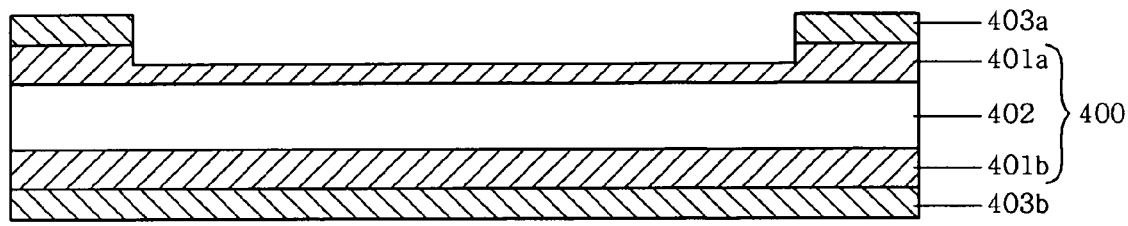

FIG. 4C is a cross sectional view after a half etching process is conducted to remove the copper foil 401a from the bonding pad side to a predetermined depth in the unit region while the copper foil 401b on the ball pad side is protected by the dry film 403b.

Figure 4D:
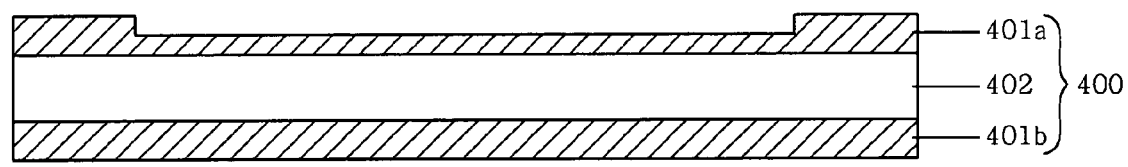

Following the removal of the copper foil 401a on the bonding pad side in the unit region to a predetermined thickness by half etching, the dry films 403a and 403b respectively deposited on the copper foil 401a of the wire bonding pad side and the copper foil 401b of the ball pad side are removed, as shown in FIG. 4D.

Since the copper foil 401a on the wire bonding side in the unit region becomes thin, there is possibility that a circuit pattern formed thereon might be cut. Particularly, when the plating lead line is cut, a plating process for a wire bonding pad may be not conducted.

Figure 4E:
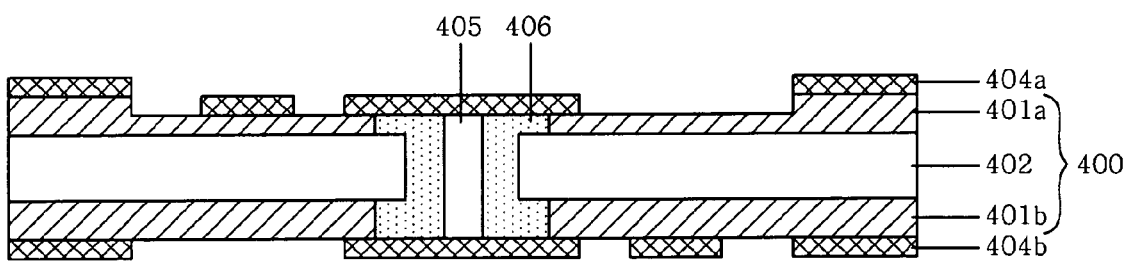

For this reason, as shown in FIG. 4E, a through hole 405 is drilled and plated to form a connection through hole 406 for connecting the copper foil 401a on the wire bonding pad side and the copper foil 401b on the ball pad side. The connection through hole 406 serves as an electric bridge between the lower foil 401b and the upper foil 401a so that the plating lead line (not shown) formed in the lower copper foil 401b is electrically connected with the plating lead line (not shown) formed in the upper copper foil 401a. Even if the plating lead line of the upper copper foil 401a is cut, as will be described later, a gold plating process can be conducted to form a gold coat 408b on a wire bonding pad 408a (FIG. 4G) using the plating lead line of the lower copper foil 401b, which is connected through the connection through hole 406 to the bonding pad 408.

Figure 6:
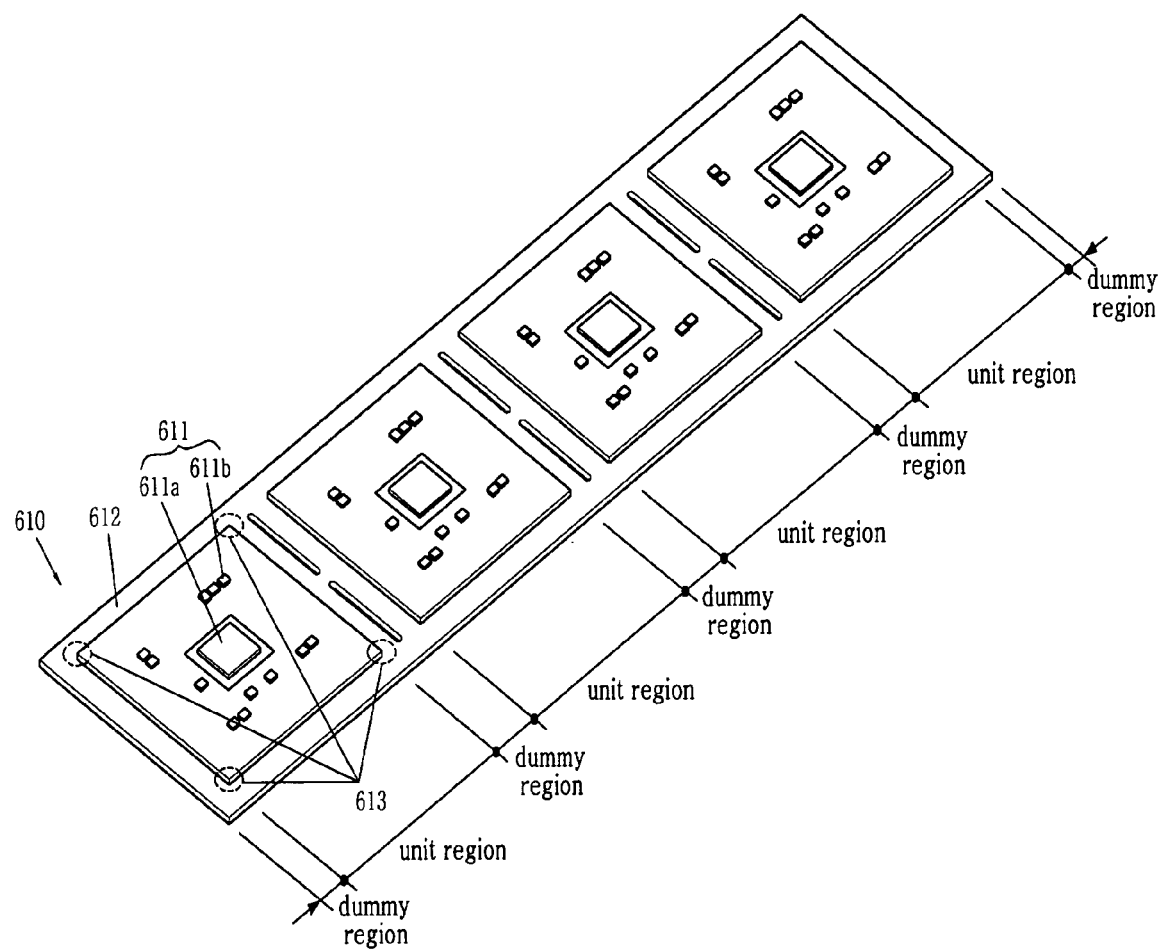
FIG. 6 is a perspective view showing a semiconductor package substrate in accordance with the present invention.

Preferably, the connection through hole 406 is formed at four corners 613 of the unit region 611, as shown in FIG. 6. The reason is that a main plating lead line (not shown) usually passes through the four corners 613. That is, when the main plating lead line is cut, the gold plating cannot assure the thickness of the plated gold coat 408b. Thus, even if the main plating lead line of the upper copper foil 401a is cut, the presence of the connection through hole 406 at the four corners 613 allows an electric current to be provided through the main plating lead line of the lower copper foil 401b, thus assuring the thickness of the gold coat. FIG. 6 shows a semiconductor package substrate 610 in accordance with an embodiment of the present invention, which is divided into a unit region 611 comprising a semiconductor device mounting portion 611a and an outer circuit pattern 611b, and a dummy region 612 around the unit region 611.

Returning to FIG. 4E, patterned dry films 404a and 404b for the formation of circuit patterns on the wire bonding pad side and the ball pad side are deposited over the copper foils 401a and 401b, respectively.

Figure 4F:
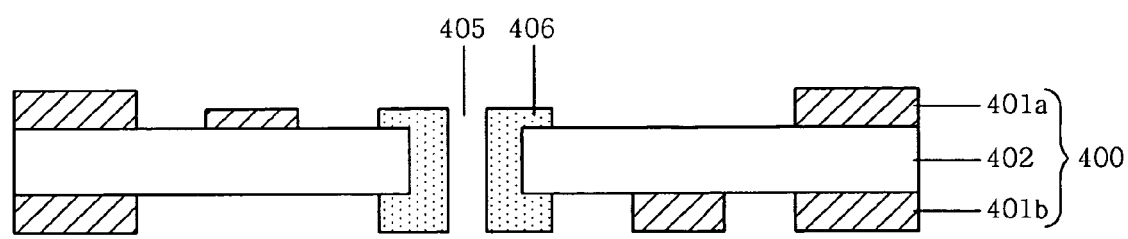

FIG. 4F is a cross sectional view after the copper foils 401a and 401b are selectively etched using an etchant, with the patterned dry films 404a and 404b serving as etching resists, followed by removing the dry films 404a and 404b with a peeling solution. Upon the pattern etching, a plating lead line to be used for gold plating is concurrently formed in the same manner.

Figure 4G:
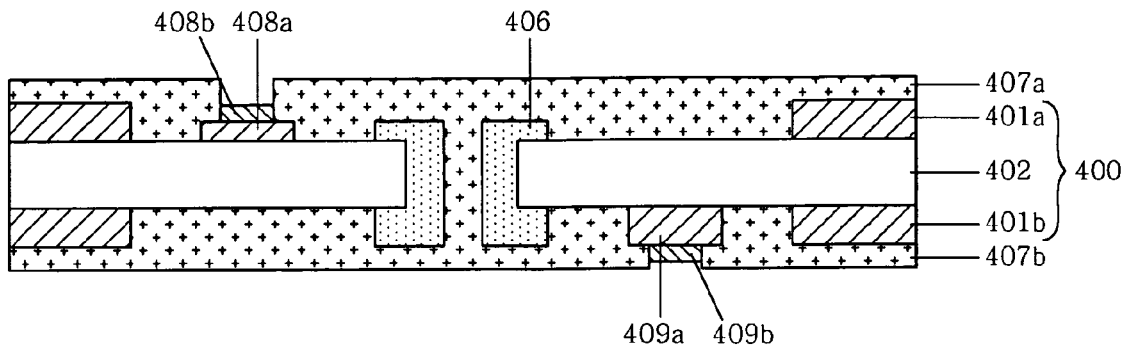

Afterwards, the resulting CCL structure is coated with solder resists 407a and 407b which are then exposed to light, developed, and dried, as shown in FIG. 4G.

In order to plate only the wire bonding pad 408a with gold, a dry film (not shown) is applied on the solder pad side of the substrate, exposed to light, and developed. Using a plating lead line, the bonding pad 406 is plated with gold 408b with the dry film serving as a plating resist. In detail, electrolytic Au plating is usually conducted for metal finishing the package substrate on which semiconductor devices are to be mounted. The reason is that electrolytic Au plating is superior to electroless Au plating in view of reliability. As mentioned above, it may occur that the plating lead line formed in the upper copper foil is cut. At this time, the gold coat 408 can be formed to a preferred thickness with electric power supplied through the connection through hole 406 from the plating lead line of the lower copper foil 401b.

Following the electrolytic Au plating, the dry film used as the plating resist is removed with a peeling solution and the plating lead line is cut using a router or a dicing process.

Then, the solder ball pad 409a is coated with OSP to form an OSP-treated surface 409b.

With reference to FIGS. 5A to 5H, a method for fabricating a semiconductor package substrate in which a circuit layer on a wire bonding side is different in thickness from that on a ball pad side are shown in a stepwise manner in accordance with another embodiment of the present invention.

Figure 5A:
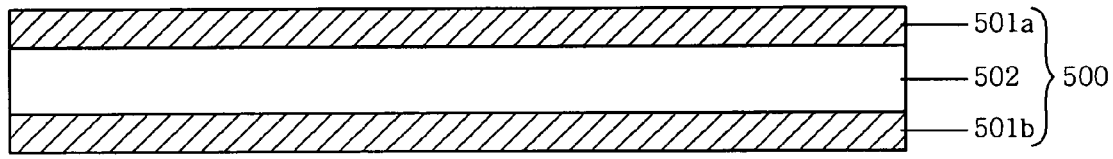
FIGS. 5A to 5H are cross sectional views showing processes of fabricating a semiconductor package substrate according to another embodiment of the present invention, in which a circuit layer formed on a wire bonding pad side differs in thickness from a circuit layer formed on a ball pad side.

FIG. 5A is a cross sectional view of a CCL 500 comprising an insulation layer 502, made from, for example, epoxy, with copper foil 501a and 501b bonded using an adhesive to respective opposite sides of the insulation layer.

Figure 5B:
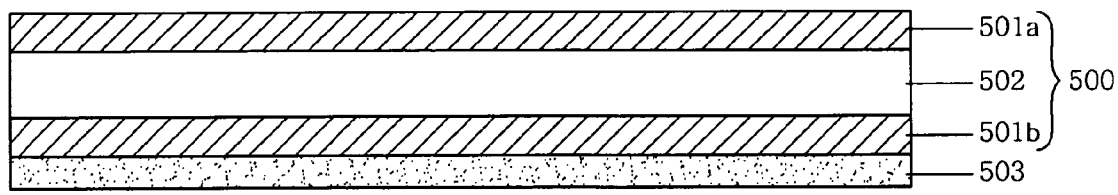

Then, as shown in FIG. 5B, a dry film 503 is deposited on the copper foil 501b of the ball pad side in order to be used as a mask in half etching the copper foil 501a of the wire bonding pad side.

Figure 5C:
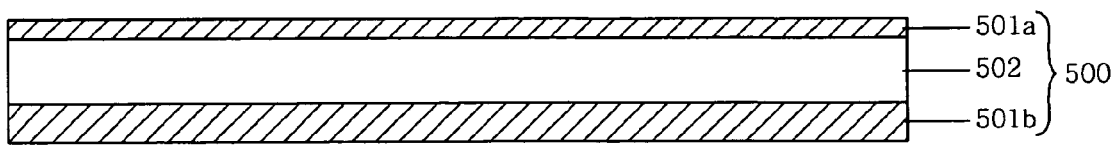

FIG. 5C is a cross sectional view after the entire copper foil 501a of the wire bonding pad side is half etched to a predetermined thickness, with the dry film 503 protecting the copper foil 501b of the solder ball pad side, followed by removing the dry film 503 from the copper foil 501b of the solder ball pad side.

Figure 5D:
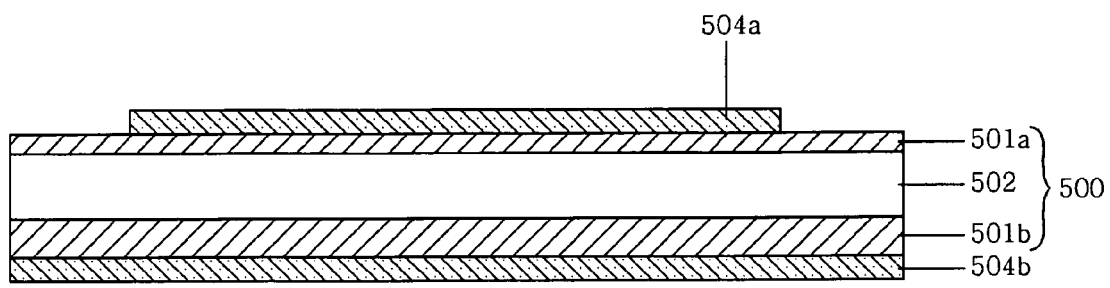

There is a need for reinforcing the copper foil 501a in the dummy region of the wire bonding pad side in order to prevent the CCL from curling. For this, as shown in FIG. 5D, the copper foil 501a of the wire bonding pad side is coated with a dry film 504a which is open at a portion corresponding to the dummy region of the wire bonding pad side while a blanket of a dry film 504b is deposited as a mask over the ball pad side.

Figure 5E:
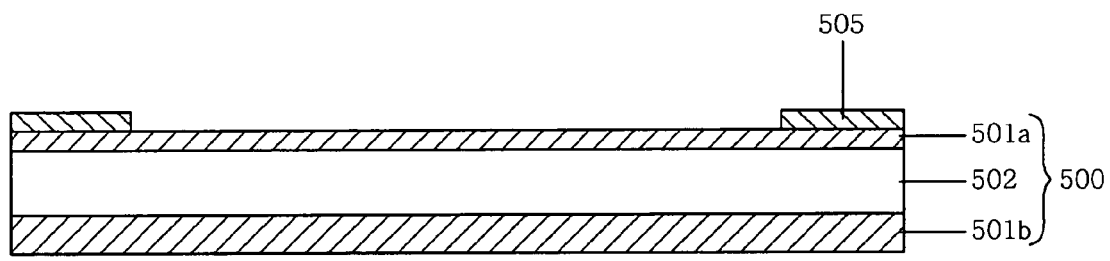

Afterwards, the exposed copper foil 501a is plated with copper 505 to increase the thickness of the copper foil in the dummy region of the wire bonding pad side, thereby preventing the CCL from curling, as shown in FIG. 5E. Following the formation of the copper coat 505, the dry films 504a and 504b respectively deposited over the copper foil 501a of the wire bonding pad side and the copper foil 501b of the ball pad side are removed.

Since the copper foil 501a on the wire bonding side in the unit region becomes thin, there is possibility that a circuit pattern formed thereon might be cut. Particularly, when the plating lead line is cut, a plating process for a wire bonding pad may not be conducted.

Figure 5F:
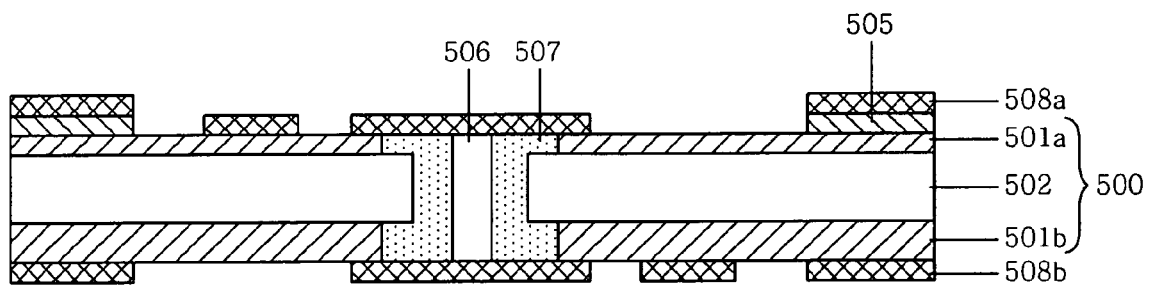

For this reason, as shown in FIG. 5F, a through hole 506 is drilled and plated to form a connection through hole 507 for connecting the copper foil 501a on the wire bonding pad side and the copper foil 501b on the ball pad side. The connection through hole 507 serves as an electric bridge between the lower foil 501b and the upper foil 501a so that the plating lead line (not shown) formed in the lower copper foil 501b is electrically connected with the plating lead line (not shown) formed in the upper copper foil 501a. Even if the plating lead line of the upper copper foil 501a is cut, as will be described later, a gold plating process can be conducted to form a gold coat 509b (FIG. 5H) on a wire bonding pad 509a (FIG. 5H) using the plating lead line of the lower copper foil 501b, which is connected through the connection through hole 507 to the wire bonding pad 509a.

Preferably, the connection through hole 507 is formed at four corners 613 of the unit region 611, as shown in FIG. 6. The reason is that a main plating lead line (not shown) usually passes through the four corners 613. That is, when the main plating lead line is cut, the gold plating cannot assure the thickness of the plated gold coat 509b. Thus, even if the main plating lead line of the upper copper foil 501a is cut, the presence of the connection through hole 507 at the four corners 613 allows an electric current to be provided through the main plating lead line of the lower copper foil 501b, thus assuring the thickness of the gold coat. FIG. 6 shows a semiconductor package substrate 610 in accordance with an embodiment of the present invention, which is divided into a unit region 611 comprising a semiconductor device mounting portion 611a and an outer circuit pattern 611b, and a dummy region 612 around the unit region 611.

Returning to FIG. 5F, patterned dry films 508a and 508b for the formation of circuit patterns on the wire bonding pad side and the ball pad side are deposited over the copper foils 501a and 501b, respectively.

Figure 5G:
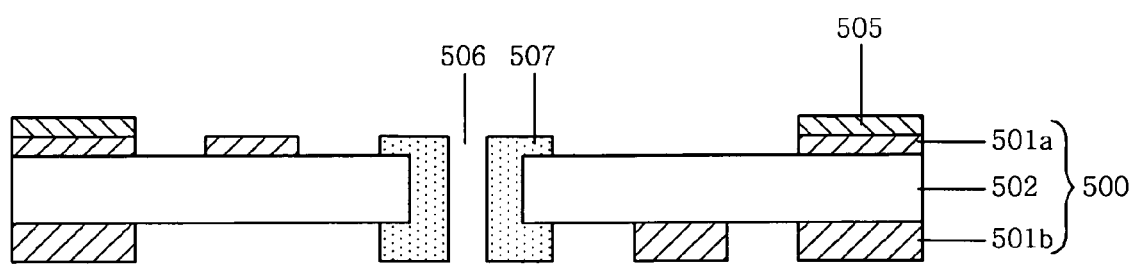

FIG. 5G is a cross sectional view after the copper foils 501a and 501b are selectively etched using an etchant, with the patterned dry films 508a and 508b serving as etching resists, followed by removing the dry films 508a and 508b with a peeling solution. Upon this pattern etching, a plating lead line to be used for gold plating is concurrently formed in the same manner.

Figure 5H:
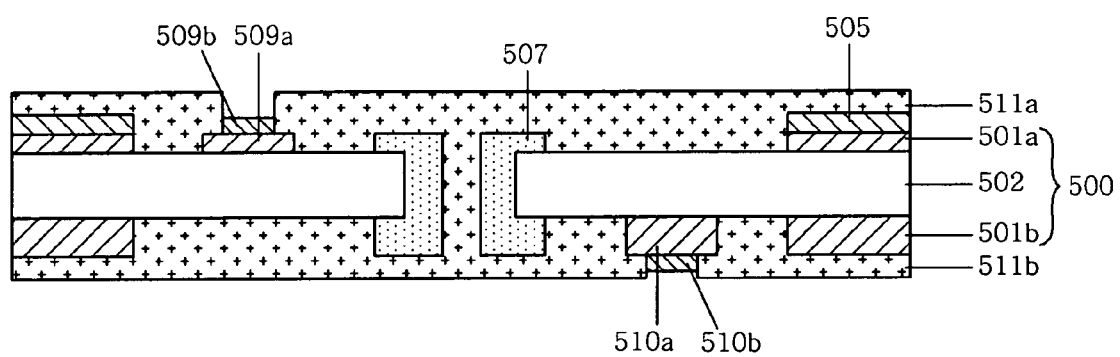

Afterwards, the resulting CCL structure is coated with solder resists 511a and 511b which are then exposed to light, developed, and dried, as shown in FIG. 5H.

In order to plate only the wire bonding pad 509a with gold, a dry film (not shown) is applied on the solder pad side of the substrate, exposed to light and developed. Using a plating lead line, the wire bonding pad 509a is plated with gold 509b, with the dry film serving as a plating resist. As mentioned above, it might occur that the plating lead line formed in the upper copper foil is cut. At this time, the gold coat 509b can be formed to a preferred thickness with electric power supplied through the connection through hole 507 from the plating lead line of the lower copper foil 501b.

Following the electrolytic Au plating, the dry film used as the plating resist is removed with a peeling solution and the plating lead line is cut using a router or a dicing process.

Then, the solder ball pad 510a is coated with OSP to form an OSP-treated surface 510b.

As described hereinbefore, the unit region of the wire bonding pad side can be formed to a small thickness in accordance with the present invention, thereby realizing fine patterns on the semiconductor package substrate according to the present invention.

In addition, the CCL of the present invention can be prevented from curling by maintaining the dummy region of the wire bonding pad side at a predetermined thickness.

Examples are described in terms of the preferred embodiment of present invention. However, it should be understood that such disclosure is not limited to the explicit description of the present invention. The description and the claims of the present invention are to be interpreted as covering all alterations and modifications within the true scope of this invention.

What is claimed is:

1. A method for fabricating a semiconductor package substrate, comprising:
   preparing a copper clad laminate, in which the insulating layer is sandwiched between two copper foils;
   depositing a second etching resist over a first side of the copper clad laminate and half etching the copper foil on a second side of the copper clad laminate;
   removing the second etching resist deposited on the first side of the copper clad laminate;
   depositing on the second side of the copper clad laminate a first plating resist which is open at a portion corresponding to the dummy region of the copper clad laminate; and
   plating the second side of the copper clad laminate and removing the first plating resist;
   depositing a first etching resist on both sides of the copper clad laminate;
   forming circuit patterns on the first etching resist, constructing circuits including a wire bonding pad and a ball pad in the copper foils of the copper clad laminate using the first etching resist, and removing the first etching resist;
   applying a solder resist to the copper clad laminate in such a way to expose the wire bonding pad and the ball pad; and
   plating the wire bonding pad with gold and subjecting the ball pad to surface treatment.

2. The method according to claim 1, further comprising forming a connection through hole through which a plating lead line formed in the first circuit layer of the copper clad laminate is electrically connected with a plating lead line formed in the second circuit layer of the copper clad laminate, after the preparation of the copper clad laminate.

3. The method according to claim 2, wherein the connection through hole is formed within the unit region of the copper clad laminate and at corners of the unit region.

* * * * *